(12) United States Patent
Gray et al.

(10) Patent No.: US 6,491,529 B2
(45) Date of Patent: Dec. 10, 2002

(54) MOLDED AND PLATED ELECTRICAL INTERFACE COMPONENT

(75) Inventors: Ian James Stafford Gray, Winchester (GB); John Impay, Syston (GB)

(73) Assignee: ITT Manufacturing Enterprises, Inc, Wilmington, DE (US)

(*) Notice: Subject to any disclaimer, the term of this patent is extended or adjusted under 35 U.S.C. 154(b) by 0 days.

(21) Appl. No.: 10/053,052

(22) Filed: Jan. 18, 2002

(65) Prior Publication Data

US 2002/0132502 A1 Sep. 19, 2002

(30) Foreign Application Priority Data

Jan. 22, 2001 (GB) ................................. 0101597

(51) Int. Cl.⁷ ............................................. H01R 12/20
(52) U.S. Cl. ......................................... 439/79; 439/931
(58) Field of Search ................................ 439/931, 604, 439/606, 701, 79

(56) References Cited

U.S. PATENT DOCUMENTS 5,344,341 A * 9/1994 Yoshino .................... 439/931
5,718,606 A * 2/1998 Rigby et al. ............... 439/931
5,743,765 A * 4/1998 Andrews et al. ............ 439/931
6,132,244 A * 10/2000 Leeman et al. ............. 439/931
6,193,568 B1 * 2/2001 Dorr ......................... 439/931

FOREIGN PATENT DOCUMENTS

| EP | 0853356 A2 | 7/1998 |
| EP | 0865120 A2 | 9/1998 |

* cited by examiner

*Primary Examiner*—Gary Paumen
(74) *Attorney, Agent, or Firm*—Roger C. Turner

(57) ABSTRACT

An electrical component includes an initial structure (40) molded of an insulative first material and having a plurality of regions (81, 82, 83) that each forms a passage (42), with the regions being largely separated to leave gaps (90, 92, 94) between them, but with the regions joined by small tabs (44). The initial structure is plated everywhere, including along the passages and on the tabs. A quantity of second insulative material (108) is overmolded to the plated initial structure to fill the gaps between them but not some portions of the passages. The tabs then can be cut away to electrically isolate the platings on the different regions, and to thereby electrically isolated contacts, such as the outer conductors of coaxial connectors, installed in the passages while the regions that form the passages are mechanically held together by the overmolding second material.

11 Claims, 6 Drawing Sheets

MOLDED AND PLATED ELECTRICAL INTERFACE COMPONENT

CROSS-REFERENCE TO RELATED APPLICATION

Applicant claims priority from U.K. patent application GB 0101597.3 filed Jan. 22, 2001.

BACKGROUND OF THE INVENTION

An interface component can be used to electrically couple connectors at the ends of cables to traces on a circuit board. One type of such component includes a molded plastic body that is molded to leave passages, and which is selectively plated to plate the passages and to form tracks leading from the platings on the passages to different mounting feet terminals that connect to different traces on the circuit board. One problem encountered in the production of such a device is that it is very difficult to assure that areas between the tracks are not plated, which would short circuit the different tracks. This is a particular disadvantage for small structures and a mass production processes. An interface component and method for producing it which assured separation of different tracks connecting different passages to different terminals, would be of value.

SUMMARY OF THE INVENTION

In accordance with one embodiment of the present invention, an electrical component and method of manufacture are provided, that includes an insulator with metal plating tracks that connect plated contact-holding parts to terminals, which assures electrical separation of the different tracks. The component includes an initial structure molded of insulative material and having a plurality of regions that each forms a contact-holding part such as a passage and that forms a terminal, the regions being separated from each other except by thin connecting tabs. A metal plating plates the initial structure, including the contact-holding parts such as passages, the terminal and areas that connect each passage application to a terminal as well as the connecting tabs. A quantity of a second insulative material is overmolded to the plated initial structure to lie between the largely separated regions so as to mechanically connect them. The plated tabs then can be easily removed to electrically separate the platings on the different regions.

One component is used to interface between traces on a circuit board and at least two connectors. The component has a flat bottom surface for lying adjacent to the circuit board, and has a plurality of terminals formed by posts that project into holes in the circuit board. The posts are formed during the molding of the initial structure and are plated, to connect to platings on the circuit board holes.

The contact-holding parts of the initial structure which are plated, may comprise passages that receive coaxial connectors. Each coaxial connector includes an outer contact that is connected to one region of the plating on a component passage, and an inner contact separated by insulation of the coaxial connector from the outer contact. An additional inner conductor surrounded by insulation, is inserted into the rest of the passage, and has an inner end connected to the inner contact of the coaxial connector and has an outer end which connects to a trace on the circuit board.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
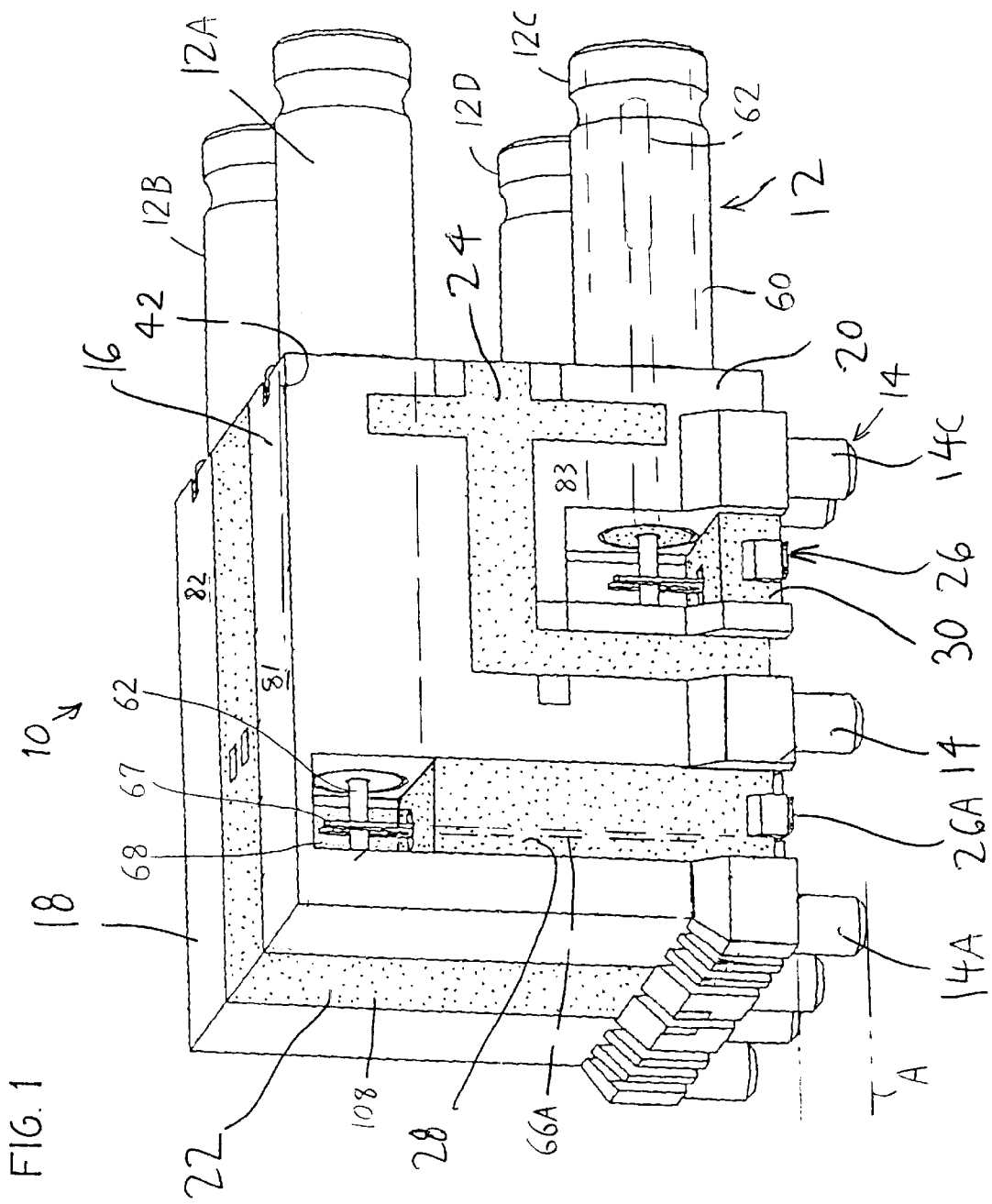
FIG. 1 is a side and top isometric view of a completed interface component of the invention, with connectors installed therein.

FIG. 1 shows a completed interface component 10 which is designed to connect contacts 60, 62 of coaxial connectors 12 to corresponding terminals 14, 26 that are connected to traces on a circuit board A. The particular interface component illustrated has four passages 42 designed to hold four coaxial connectors labeled 12A, 12B, 12C and 12D and connect them to corresponding sets of the terminals. In particular, each outer contact 60 of a coaxial connector is connected to a post terminal 14, while each inner coaxial contact 62 is connected to a surface-mount terminal 26.

The interface component is formed using Molded Interconnect Device (MID) technology, wherein an insulative plastic is molded and is then plated with metal to carry electrical signals. In the past, a molded component was selectively plated so that certain areas formed tracks that each could carry an electrical signal and so the different tracks were electrically isolated from each other by not plating areas in between the tracks. In practice, the areas in between sometimes are plated and cause a short circuit, especially in components of small size.

Figure 2:
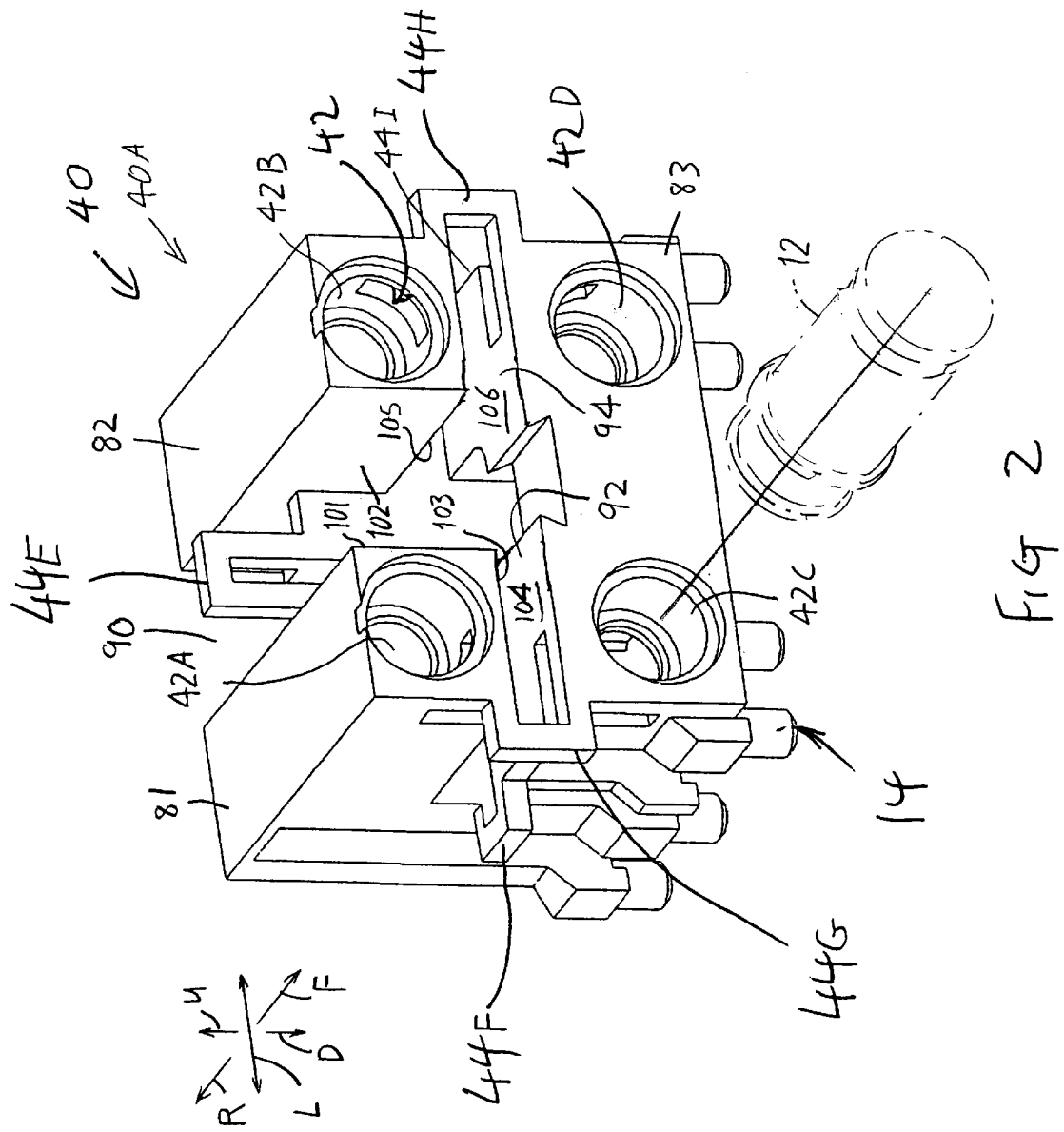
FIG. 2 is a front and top isometric view of an initial structure which is part of the interface component of FIG. 1.

FIG. 2 shows an initial structure 40 which is an integral structure formed by molding a first insulative polymer, or plastic in a mold. The initial structure has three regions 81, 82, 83 that are largely physically separated from each other in that there is a gap 90, 92, 94 between the regions, except for connecting tabs 44E–44I. Each connecting tab has a smallest cross-sectional area that is less than 10% of the area of each of two different separated regions such as 101, 102 that largely face each other. FIG. 2 shows another pair of areas 103, 104 that largely face each other, and a pair 105, 106 of areas that largely face each other.

After the initial structure 40 has been molded, it is metal plated over its entire area. As result, connecting wall surfaces that extend between contact-holding parts and terminal parts, including the passage surfaces and including the post terminals parts or posts 14, are plated. The plated initial structure, represented by 40A, has the same appearance as the unplated initial structure 40 (but with a metallic finish). After the initial structure 40 has been plated, each of the four coaxial connectors 12 are inserted in corresponding passages 42.

Figure 3:
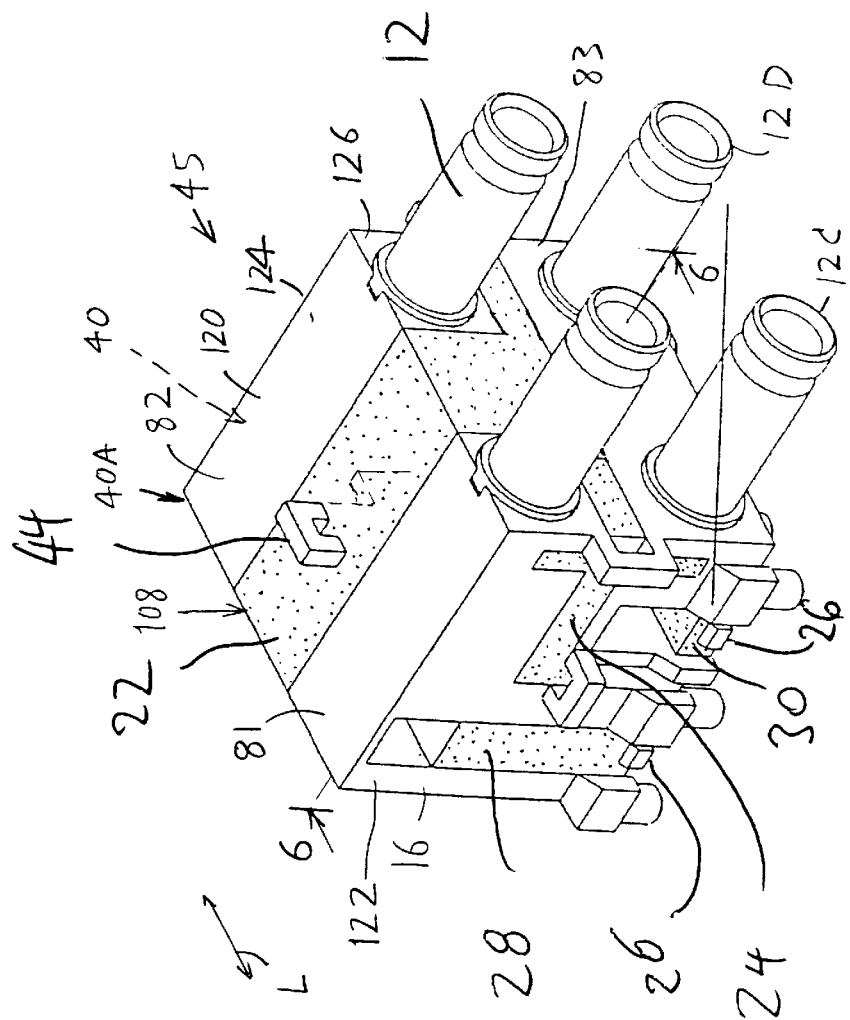
FIG. 3 is a top, front and side isometric view of the initial structure of FIG. 2, after the initial structure has been plated and a second polymer material has been overmolded to it, but before any connecting tabs have been removed.
Figure 4:
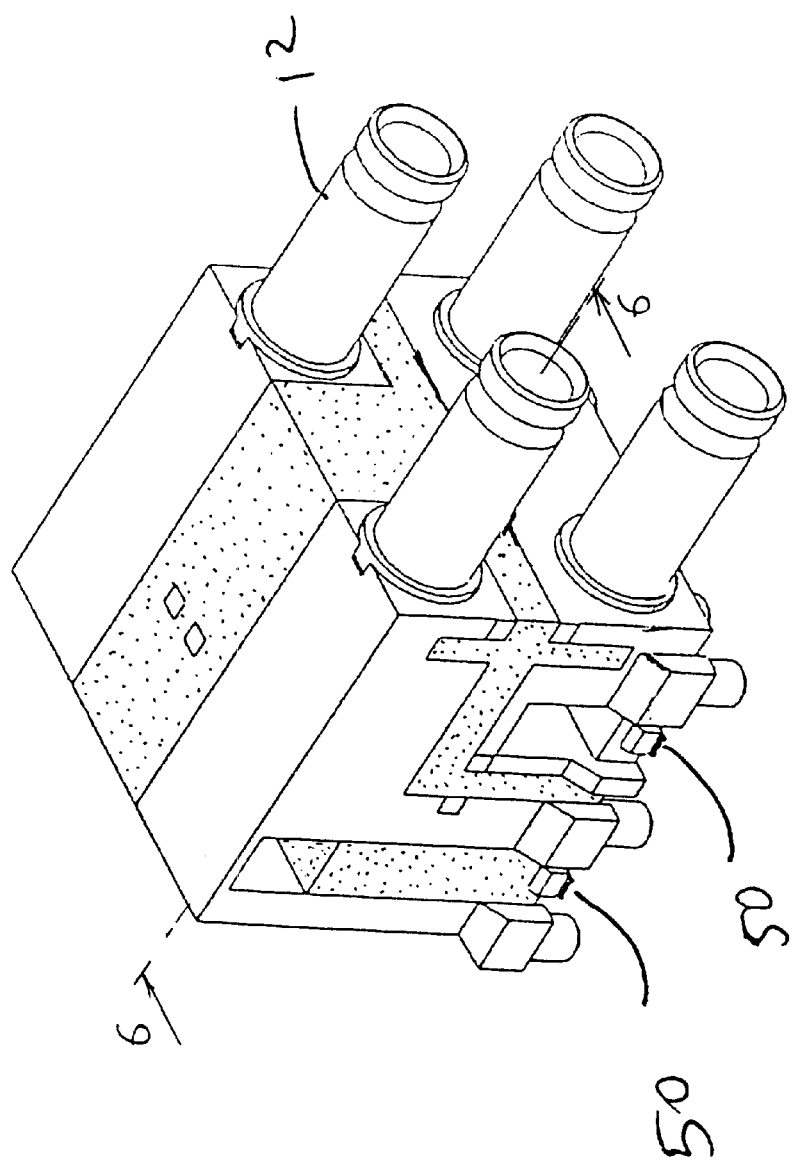
FIG. 4 is a view similar to FIG. 3, but with the connecting tabs removed.
Figure 6:
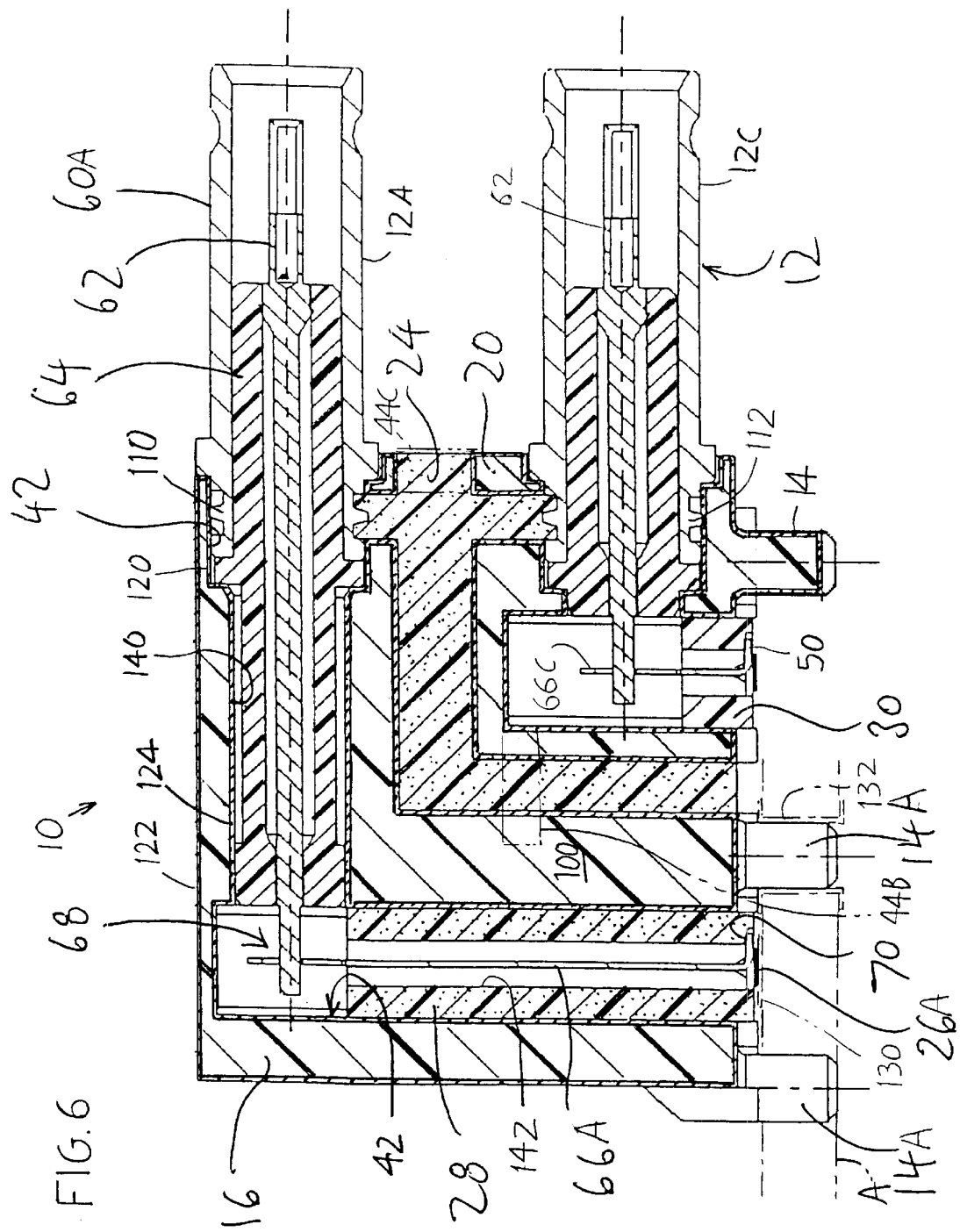
FIG. 6 is a sectional view taken on line 6—6 of FIG. 4.

After the initial structure has been plated and the coaxial connectors 12 have been inserted, a second insulative plastic or polymer 108 is overmolded to the plated initial structure with coaxial connectors, to produce the intermediate structure shown at 45 in FIG. 3. It is noted that the second insulative material can be the same as the first material. The second insulative material is overmolded three gap areas to form gap-filling parts designated 22, 24, and 26 that fill the three gaps between the three regions 81–83 of the structure. Additional regions such as 28, 30 of overmold material fill portions of the passages. The overmolded plastic holds the three regions together. As shown in FIG. 6, the overmolded plastic includes portions 110, 112 around the passages that help to hold the coaxial connectors 12 in place. The overmolded plastic surrounds much of the connecting tabs such as 44B and 44C, which results in even more secure holding of the three regions together. The overmolded plastic also protects some areas of the plating to maintain electrical connections even if the exposed areas of the plating are severely scratched. Applicant indicates overmolding material in the drawings by stippling.

The intermediate structure 45 of FIG. 3 is not yet finished because of the presence of the tabs 44 that are plated and that connect the regions 81–83 together. As a result, in many cases the tabs 44 are removed. The intermediate structure 45 is largely in the shape of a box or parallelepiped, with six largely flat sides, especially if the coaxial connectors are not considered. Each of the tabs 44 projects beyond the largely flat sides. In particular, there are tabs 44 only on the top 120 and laterally L opposite sides 122, 124 of the structure. There are no tabs at the front 126, so the coaxial connectors do not interfere with removal of the tabs. In the particular structure shown, there are no tabs on the rear face 128, although they could be placed there. With the tabs projecting beyond the flat surfaces of the top and opposite sides of the structure, and with each tab having a small cross section, the tabs can be easily removed. This can be accomplished by cutting them off with a saw or by other means.

After the tabs have been cut away, the three regions 81–83 are electrically isolated from each other. It is noted that the outer contacts of coaxial connectors 12C and 12D are connected together because they are mounted in parts of the same region 83.

When the contacts on each interface region are contacts of a coaxial connector, it is often the case that the outer contacts of all coaxial connectors are connected to the same potential, this generally being the ground or earth potential. In that case, it is not necessary to cut away the tabs 44. However, even in that case, the tabs can be cut away and the outer contacts of the coaxial connectors connected together at the traces of the circuit board or elsewhere.

As shown in FIG. 6, to complete the interface component, applicant connects inner or central conductors such as 66A and 66C to the inner contacts 62 of the coaxial connectors. As shown in FIG. 1, this can be accomplished by forming the central conductor such as 66A with a forked end at 67, which receives an end of the inner contact 62 of the coaxial connector. The passage 42 of the particular interface component are each right angle passages that each has two right angle passage portions 140, 142 (FIG. 6). Outer ends of the central conductors such as 66A form the terminals such as 26A. Insulation 64 of each coaxial connector is preferably part of a unit that includes the inner and outer conductors 62, 60. The insulation at 28 that lies around the central conductor 66A is preferably part of the overmold and includes a recess 10 for receiving the bottom of conductor 66A.

FIG. 6 shows that the outer conductor 60A of the coaxial connector 12A engages a plated contact-engaging part 120 which is connected by outer and inner plating portions at 122, 124 to pins 14A. The inner plating 124 plates the walls of the passage 42, including the contact-engaging part 120. The cylindrical platings help maintain a characteristic impedance of the coaxial connection extending along the passage. The circuit board A has multiple conductive traces including a trace 130 that engages a terminal 26A and a trace 132 that plates a hole in the circuit board and that engages the plated post 14A.

Figure 5:
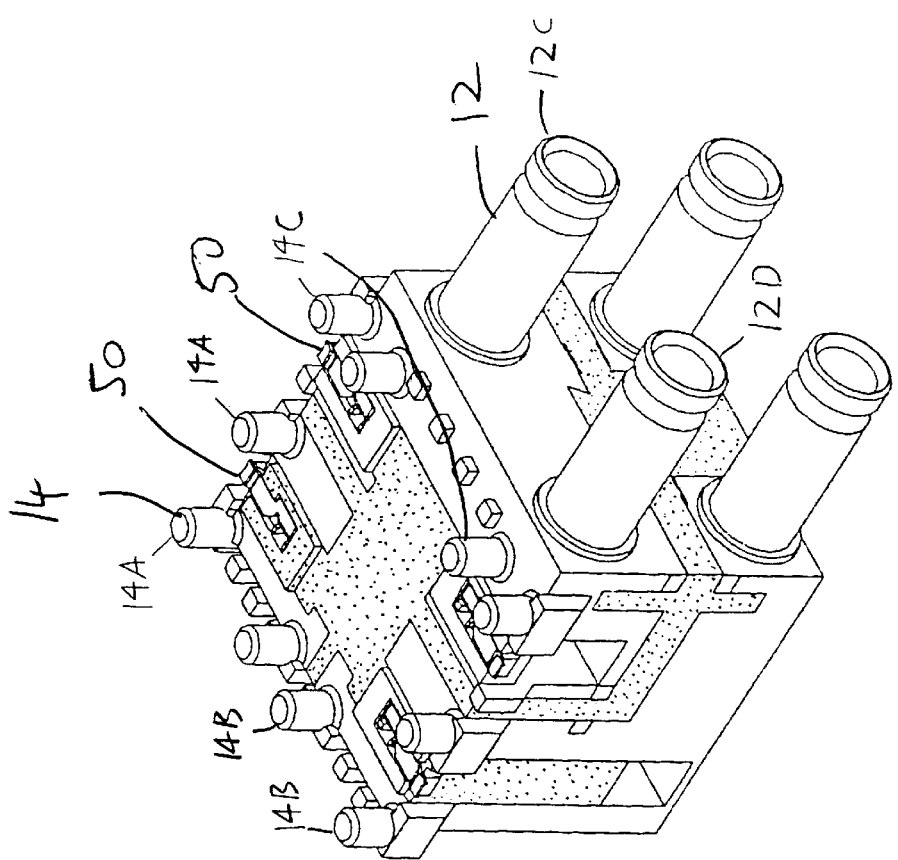
FIG. 5 is a bottom and front isometric view of the finished interface component of FIG. 1.

FIG. 5 shows ten post terminals labeled 14A, 14B and 14C. Posts 14C connect to outer contacts of coaxial connectors 12C and 12D.

In the above example, applicant uses a series of plated posts that extend into plated holes in the circuit board, and a plurality of surface mount terminals. Other combinations can be used, as with all surface mount terminals or all pin terminals. The first material of the initial structure, is selected to facilitate the plating of it. The second material used for overmolding, does not require plating, and may be selected to optimize its dielectric properties.

While terms such as "top", "bottom", etc. have been used to describe the interface component as it is illustrated, it should be understood that the interface component can be used in any orientation with respect to the Earth.

Thus, the invention provides an electrical interface component which is constructed by MID technology wherein a polymer initial structure has an overall plating to form electrical connections, but which results in a plurality of electrically separated regions of a single component. This is accomplished without relying on avoidance of plating at selected areas of the initial structure. The component includes an initial structure molded of insulative plastic and having regions that include contact-engaging parts and terminals, with the regions being largely separated from one another to leave gaps between most adjacent areas of the different regions. An overmolding of insulative plastic fills the gaps between regions to hold the regions together. The regions can be initially held together by tabs of small cross-section that can project from largely flat faces of the overmolded component, and that can be cut away to electrically isolate the regions from each other. The overmolding can be used to help fix contacts, such as the contacts of coaxial connectors, in passages of the regions. The plating preferably plates passages of the different regions.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electrical component comprising:
   an initial structure formed of insulative material, said initial structure having a plurality of contact-holding parts, a plurality of terminals parts, a first connecting wall with a surface that can be plated to electrically connect a first of said contact-engaging parts to a first of said terminal parts, and a second connecting wall with a surface that can be plated to electrically connect a second of said contact-holding parts to a second of said terminals parts;
   a metal plating that covers the entire surface of said initial structure to form a plated initial structure, said plating covering said contact-holding parts and said first and second connecting walls, and said plating covering said terminal parts to form terminals;
   a majority of said first and second connecting walls are physically separated and form a gap between them, and including a quantity of insulative polymer overmold material which is overmolded to said plated initial structure and that lies in said gap and that mechanically holds said connecting walls together.

2. The electrical component described in claim 1 wherein:

said plated initial structure and said overmold material form a primarily flat bottom surface for lying over a face of a circuit board that has through holes;

each of said terminals includes a metal plated post for insertion into a circuit board hole.

3. The electrical component described in claim 2 including a circuit board having a plurality of plated holes and having traces extending to the platings on said holes, and wherein:

each of said said plated posts lies in one of said plated holes of said circuit board.

4. The electrical component described in claim 1 wherein:

said quantity of overmold insulative material covers a portion of said metal plating that connects each of said contact-holding parts to each corresponding terminal part.

5. The electrical component described in claim 1 wherein:

said initial structure includes at least one connect tab that extends between said first and second connecting walls to hold them together before said quantity of overmold material was overmolded to said initial structure.

6. The electrical component described in claim 5 wherein:

said overmold material surrounds a portion of said tab, whereby to more securely hold said overmold material to said connecting walls of said plated initial structure.

7. The electrical component described in claim 1 wherein:

each of said contact-holding parts includes walls forming a passage with passage walls and opposite passage end portions, said metal plating covers said passage walls, and said overmold material does not fill a first of said passage end portions; and including a plurality of coaxial connectors each lying in one of said first passage end portions, each coaxial connector having an outer contact in engagement with metal plating on the corresponding first passage end portion and each coaxial connector having a coax insulation isolating a first inner contact from the outer contact;

a plurality of second inner conductors each having an inner end connected to one of said first inner contacts and an outer end lying at an end of a second passage portion that is opposite the corresponding coaxial connector.

8. An electrical component comprising:

an initial structure molded of an insulative first material and having a plurality of regions that each forms a passage with first and second passage end portions that have respective first and second passage ends, said regions having areas that largely face each other but that are separated from each other to leave gaps between said regions except for connecting tabs formed by said first material and connecting pairs of said regions, each connecting tab having a cross-section less than one-tenth the area of each of said regions that largely faces another of said regions;

a metal plating that plates said initial structure including said passages and said connecting tabs to form a plated initial structure;

a quantity of second insulative material which is overmolded to said plated initial structure and which lies in said gaps and connects said regions, but which does not fill at least said first passage end portions and which does not cover projecting parts of said connecting tabs, to thereby enable said projecting parts of said connecting tabs to be cut away to electrically isolate plating portions on different ones of said regions.

9. The electrical component described in claim 8 including:

a plurality of inner conductors that each extends through one of said passages, and a passage insulation that surrounds at least a portion of each inner conductor and that lies between the inner conductor and the plated walls of the passage, each inner conductor having opposite ends that each lies adjacent to a different one of said passage ends.

10. The electrical component described in claim 9 including:

a plurality of coaxial connectors that each has an outer contact that lies in a first end portion of one of said passages, each coaxial connector having an inner contact that forms a portion of one of said inner conductors and an insulation portion that forms a portion of said passage insulation.

11. The electrical component described in claim 8 including a circuit board with a Plurality of plated circuit board holes, and wherein:

said initial structure has a bottom surface lying facewise adjacent to said circuit board and a plurality of posts that depend from said bottom surface and that project into said circuit board holes, said metal plating covers said posts and connects to plating in said passages.

\* \* \* \* \*